United States Patent [19]
Bannister et al.

[11] 3,983,503
[45] Sept. 28, 1976

[54] HIGH VOLTAGE AMPLIFIER

[75] Inventors: Lawrence H. Bannister, Dedham; Richard H. Baker, Bedford, both of Mass.

[73] Assignee: Massachusetts Institute of Technology, Cambridge, Mass.

[22] Filed: Sept. 23, 1974

[21] Appl. No.: 508,293

[52] U.S. Cl. .................................. 330/18; 330/22; 330/40
[51] Int. Cl.² .......................................... H03F 3/42
[58] Field of Search ................... 330/18, 19, 22, 40

[56] References Cited
UNITED STATES PATENTS

| | | | |
|---|---|---|---|
| 2,888,525 | 5/1959 | Eckess | 330/18 X |
| 2,926,307 | 2/1960 | Ehret | 330/19 X |
| 2,999,984 | 9/1961 | Beck | 330/19 X |
| 3,603,892 | 9/1971 | Paine | 330/18 |

Primary Examiner—R. V. Rolinec
Assistant Examiner—Lawrence J. Dahl
Attorney, Agent, or Firm—Arthur A. Smith, Jr.; Robert Shaw; Martin M. Santa

[57] ABSTRACT

A linear amplifier that is able to yield a maximum output voltage substantially greater than the breakdown voltage of the individual amplifying elements used and substantially greater than the voltage of a primary electric energy source that powers the amplifier. The amplifier consists of a plurality of stages connected in cascade, each stage, in turn, controlling the voltage level at which subsequent stages operate.

6 Claims, 7 Drawing Figures

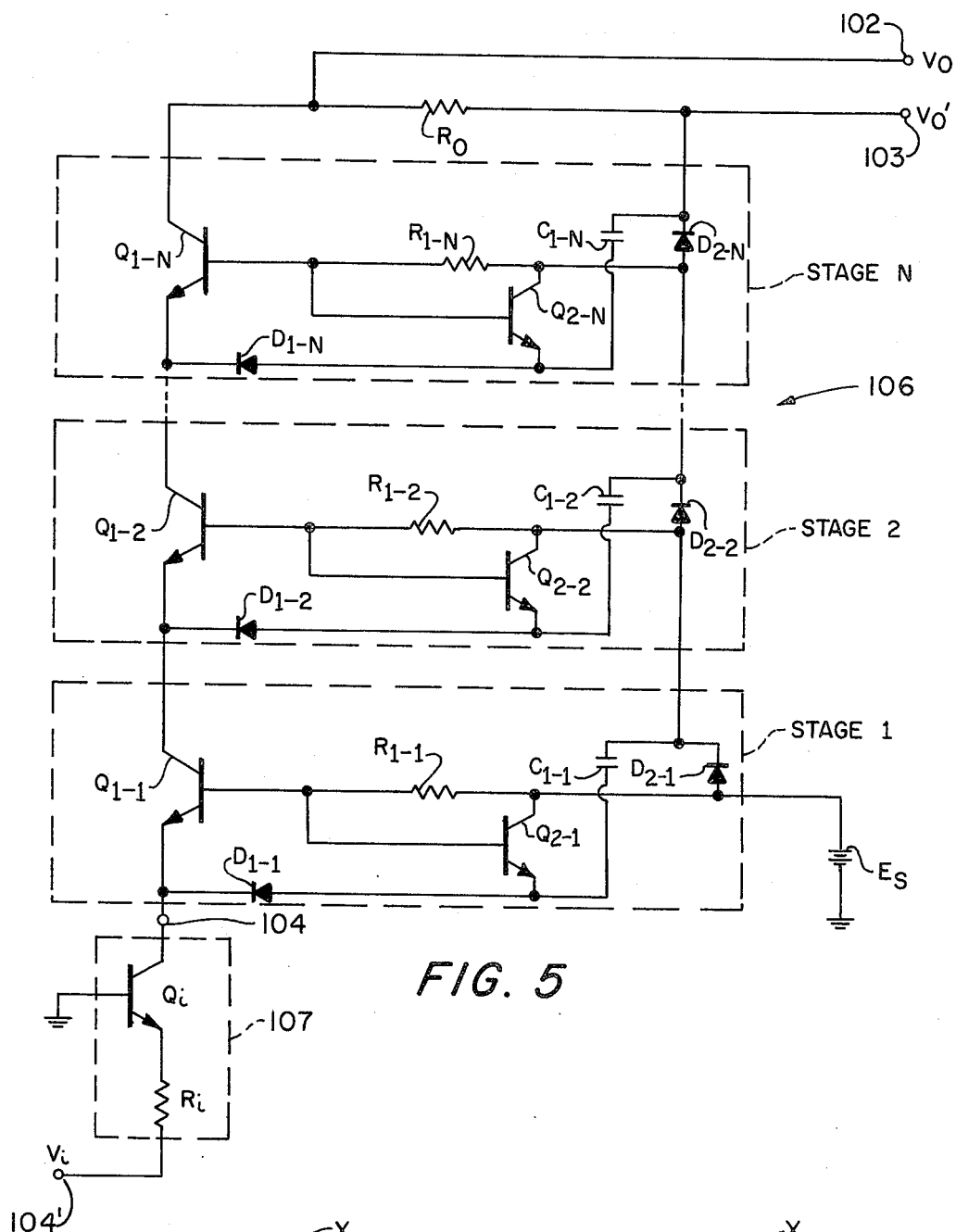
*FIG. 5*
*FIG. 6*  *FIG. 7*

HIGH VOLTAGE AMPLIFIER

The invention described herein was made in the performance of work under a National Aeronautics and Space Administration contract and is subject to the provisions of Section 305 of the National Aeronautics and Space Act of 1958, Public Law 85–568 (72 Stat. 435; 42 U.S.C. 4257.)

The present invention relates to amplifiers and, more particularly, to amplifiers wherein the output voltage is controlled by a series string of transistors arranged so that the maximum available output voltage substantially exceeds the breakdown voltage of the individual transistors used.

As is apparent in the discussion that follows, the present system is directed primarily to amplifiers of the cascade type wherein the output voltage is controlled by a series connected string of transistors. Customary amplifiers of this type have the definite restriction of being non-linear because the cascaded transistor elements act in series to control the output voltage but are themselves controlled in parallel by a low voltage control signal.

Accordingly, it is an object of the present invention to provide an amplifier wherein an input electric signal linearly controls an output electric signal that can have a voltage level of several thousand volts.

Another object is to provide an amplifier whose maximum output voltage can be substantially greater than the breakdown voltage of the individual amplifying elements used.

Another object is to provide an amplifier whose output voltage is directly and linearly proportional to the magnitude of an input electric current.

Another object is to provide an amplifier wherein the system gain is controlled primarily by linear passive elements.

Another object is to provide a very efficient, high voltage, amplifier.

Another object is to provide a high voltage amplifier with a low output impedance.

Another object is to provide an amplifier whose maximum output voltage can be substantially greater than the voltage of the primary energy source for the amplifier.

Another object is to provide a linearly controllable voltage multiplier.

Another object is to provide an amplifier having a very large voltage gain.

These, and still further objects, are discussed in what follows.

The objects of the invention are attained in an amplifier that comprises a plurality of stages connected in cascade and arranged so that an input electric current signal is diverted to flow in one or more of several available current paths so that the output signal is proportional to the input signal and is made up of a plurality of increments. Each stage has transistor means having a current amplification factor greater than unity and electric storage means connected to serve as electric power supply means for the next stage.

The invention is hereinafter described with reference to the accompanying drawing in which:

FIG. 5 is a schematic circuit diagram showing three stages of an N-stage high voltage amplifier requiring only one low voltage primary energy source;

FIG. 6 shows in block diagram form supply voltage means that can be connected between points $X_1 - Y_1$, $X_2 - Y_2 \ldots X_N - Y_N$ in FIG. 1, for example; and FIG. 7 shows schematically a particular form (i.e., solar cells) of the supply voltage means of FIG. 6.

Figure 1:
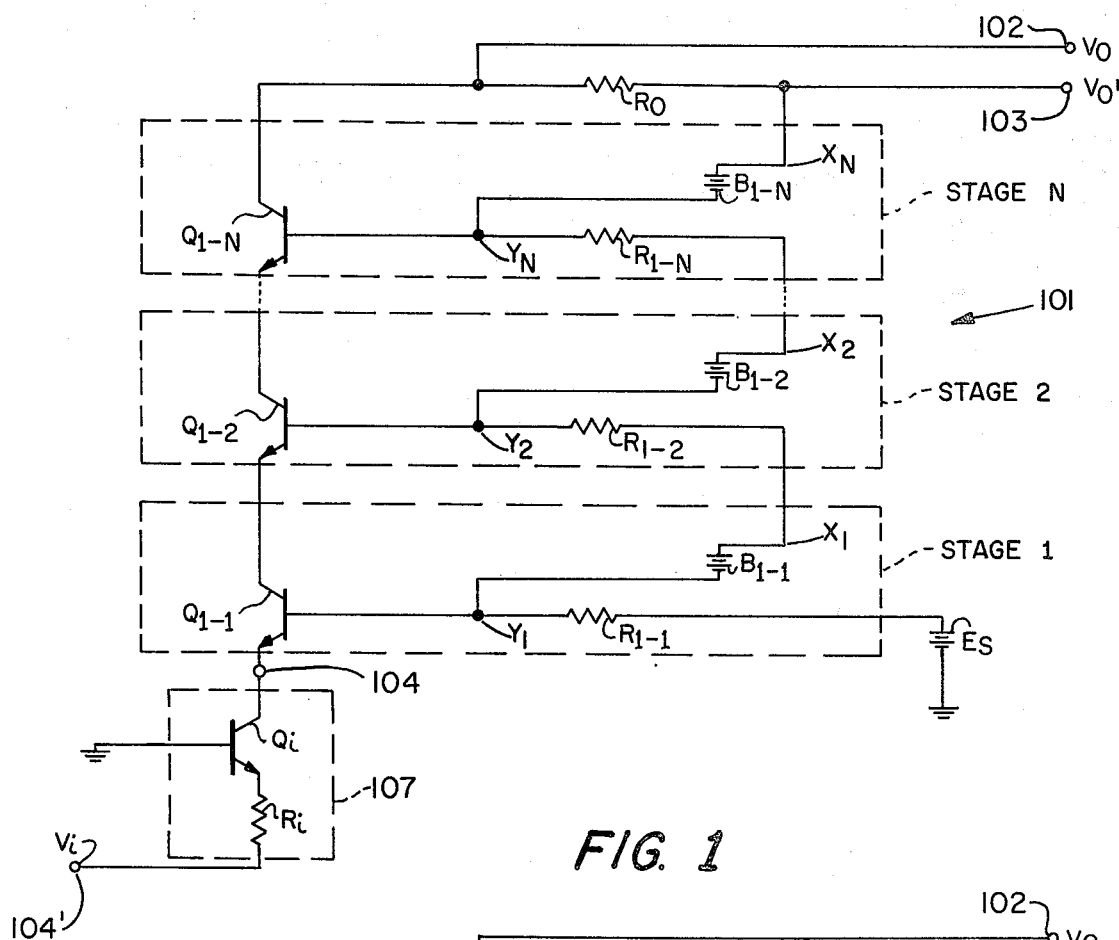
FIG. 1 is a schematic circuit diagram showing three stages of an N-stage high voltage amplifier.

Turning now to the figures, a high voltage amplifier is shown at 101 in FIG. 1 having an input or input terminal 104 and two possible output terminals 102 and 103. The amplifier system 101 comprises a plurality of stages, Stage 1, Stage 2, . . . Stage N, connected in cascade between the input and the output of the system. Stage 1, Stage 2, . . . Stage N each comprises transistors $Q_{1-1}$, $Q_{1-2}$, . . . $Q_{1-n}$, resistors $R_{1-1}$, $R_{1-2}$, . . . $R_{1-N}$, and batteries $B_{1-1}$, $B_{1-2}$, . . . $B_{1-N}$, respectively. The transistors $Q_{1-1}$, $Q_{1-2}$, . . . $Q_{1-N}$ are thus connected in a series string, the resistors $R_{1-1}$, $R_{1-2}$, . . . $R_{1-N}$, respectively, being connected to the base circuit of the associated transistor. The battery (or other supply voltage means) associated with one transistor and resistor pair is connected to the associated resistor of the next transistor of the string; thus, for example, the battery $B_{1-1}$, which is associated in Stage 1 with the transistor and resistor pair $Q_{1-1}$ and $R_{1-1}$, is connected through the resistor $R_{1-2}$ to the base of the next transistor $Q_{1-2}$ of the string of transistors. Because of this connection, the potential (i.e., $V_1$, $V_2$ . . . in FIG. 2) at the base of one transistor, $Q_{1-1}$ for example, is connected as bias for the next transistor, $Q_{1-2}$, for example, of the string of transistors. In one embodiment, all transistors are 2N3742, all batteries are 225 volt photographic flash batteries, the resistor shown at $R_i$ is 1 Megohm, and all other resistors are 22 Megohms.

As shown later, the linear amplifier 101 is operable to provide an output voltage at either the terminal 102 ($V_o$) or at the terminal 103 ($V_o'$) that is linearly proportional to an input current (the current $I_{ci}$ in FIG. 2, for example) which, in the circuitry in the figures, is the input current at the terminal 104. (In all the figures an input voltage $V_i$ at a terminal 104' is conditioned to provide the input current signal by an input signal conditioner 107 composed of an input resistor $R_i$ and input transistor $Q_i$.)

In the figures and in the discussion that follows, attention is restricted to a three-stage system. It should be understood that this restriction is adopted only for descriptive convenience and simplicity, and that any of the portrayed or described systems can be extended to an arbitrarily large number of stages. Conceptually, at least, there is no limit on the number of stages that can be used and, consequently, no limit on the magnitude of the output voltage that can be obtained. Anyway, an output voltage of, say, 5,000 volts is easy to obtain and this can be compared with maximum outputs of a few hundred volts from more conventional amplifiers. Also, skilled workers in the art in which the invention lies will understood that the choice of circuit elements lumped to form a stage is arbitrary, but consistent throughout this specification.

Figure 2:
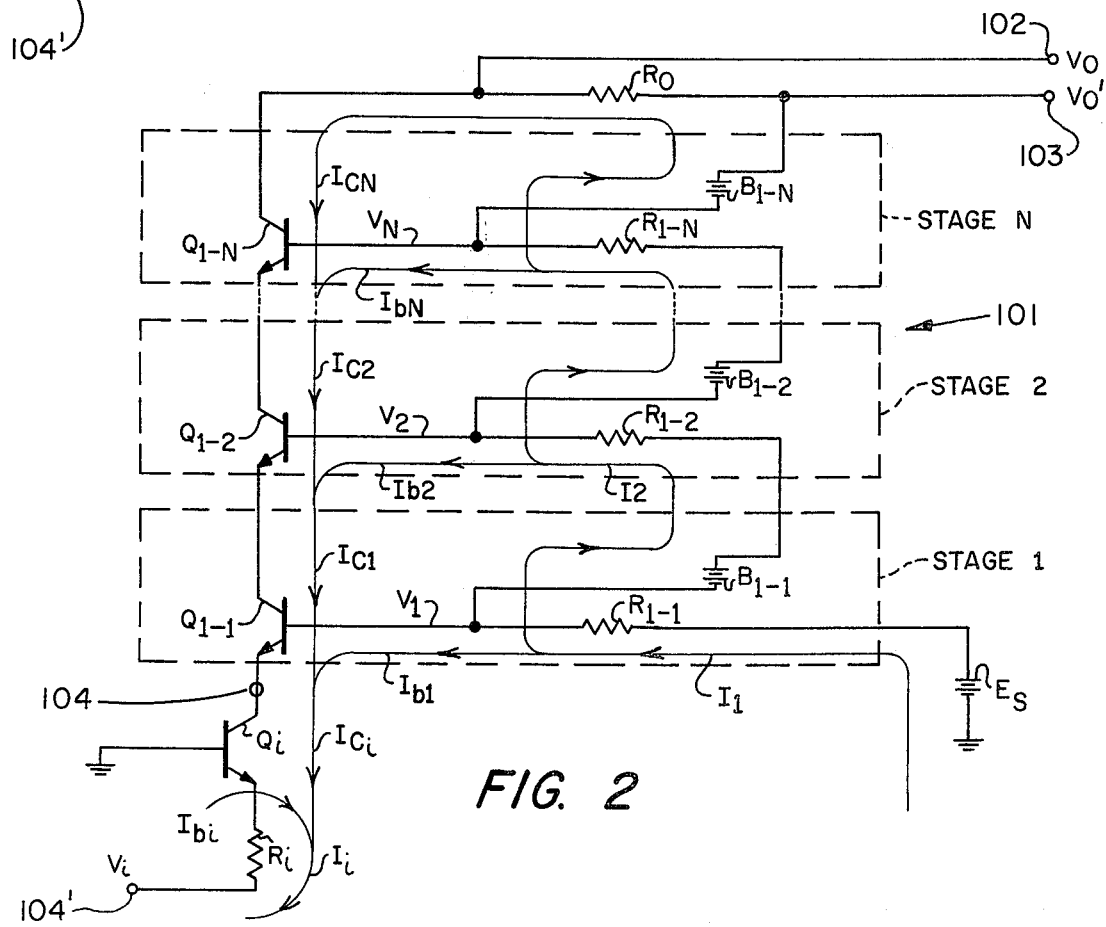
FIG. 2 is similar to FIG. 1 but additionally shows current flow paths and intermediate voltages to facilitate discussion of the system operation.

The operation of the amplifier 101 is explained now with reference to FIG. 2 wherein current flow paths and intermediate voltages are denoted to facilitate the discussion. The electric current flow in the various paths indicated in FIG. 2 bear the following relationships:

$$I_1 = I_{b1} + I_{c1}$$
$$= I_{b1} + I_{b1} + I_{c1}$$
$$= I_{b1} + I_{b1} + I_{b2} + I_{c2}$$

and so on. It will be appreciated that:

$$I_{cM} = \beta_M I_{bM},$$

where $I_{cM}$, $\beta_M$, and $I_{bM}$ denote the collector current, the current amplification factor, and the base current, respectively, of the $M^{th}$ transistor. Also, it will be appreciated that:

$$I_1 = I_{b1} + I_{c1} = I_{c1}$$

$$I_2 = I_{b2} + I_{c2} = I_{c1}$$

and so on. It follows that:

$$I_{c1} = I_1 - I_{b1}$$
$$= I_1 - \frac{I_{c1}}{\beta_i}$$
$$= \left(\frac{\beta_i}{\beta_i + 1}\right) I_1$$
$$I_{c1} = \left(\frac{\beta_i}{\beta_i + 1}\right) I_{c1}$$
$$= \left(\frac{\beta_i}{\beta_i + 1}\right) \left(\frac{\beta_i}{\beta_i + 1}\right) I_1$$

and so on, where $\beta_i$ is the amplification factor for the input transistor $Q_i$.

Now, still with reference to FIG. 2, it can be seen that:

$$V_1 = E_s - I_1 R_{1-1}$$
$$= E_s - \left(\frac{\beta_i}{\beta_i + 1}\right) I_1 R_{1-1}$$

$$V_2 = V_1 + B_{1-1} - I_2 R_{1-2}$$
$$= V_1 + B_{1-1} - \left(\frac{\beta_i}{\beta_i + 1}\right)\left(\frac{\beta_i}{\beta_i + 1}\right) I_1 R_{1-2}$$
$$= E_s + B_{1-1} - \left(\frac{\beta_i}{\beta_i + 1}\right) I_1 R_{1-1} - \left(\frac{\beta_i}{\beta_i + 1}\right)\left(\frac{\beta_i}{\beta_i + 1}\right) I_1 R_{1-2}$$

and so on, where $E_s$ is the potential of a battery or other primary source of electric energy connected to power the transistor $Q_{1-1}$.

In the above expressions, as well as in what follows, the terms $E_s$, $B_{1-1}$ ... and $R_{1-1}$ ... and $R_o$ designate a magnitude as well as the circuit elements itself; thus, for example, the term $R_o$ is the resistance value of a load resistor $R_o$.

To simplify the algebra, it is assumed now that all the battery voltages are equal, that is:

$$E_s = B_{1-1} = B_{1-2} = \ldots = B_{1-N} = E;$$

and it is assumed that all transistors have equal current amplification factors, that is:

$$\beta_i = \beta_1 = \beta_2 = \ldots = \beta_N = \beta$$

and it is assumed that all resistors except $R_i$ are equal, that is:

$$R_{1-1} = R_{1-2} = \ldots = R_{1-N} = R_o = R$$

With these simplifying substitutions, it follows that:

$$V_2 = E + E - \left(\frac{\beta}{\beta+1}\right) I_1 R - \left(\frac{\beta}{\beta+1}\right)^2 I_1 R$$
$$= 2E - I_1 R \left[\left(\frac{\beta}{\beta+1}\right) + \left(\frac{\beta}{\beta+1}\right)^2\right]$$

Continuing the foregoing exercise for an N-stage system, it will be found that:

$$V_o = (N+1)E - I_1 R \left[\left(\frac{\beta}{\beta+1}\right) + \left(\frac{\beta}{\beta+1}\right)^2 + \ldots + \left(\frac{\beta}{\beta+1}\right)^{N+1}\right]$$

To demonstrate the import of this expression, it is now assumed that the current amplification factor of each transistor is much greater than unity, that is:

$$\beta \gg 1$$

Incorporating this approximation shows:

$$V_o \approx (N+1)E - I_1 R (N+1)$$
$$= (N+1)(E - I_1 R)$$

and, because:

$$I_i \approx \frac{V_i}{R_i}$$

this may be written as:

$$V_o \approx (N+1)E - V_i \frac{(N+1)R}{R_i} = (N+1)\left[E - \left(\frac{V_i}{R_i}\right) R\right]$$

From the foregoing, it can now be seen that the output voltage $V_o$ or $V_o'$ is linearly proportional to the current $I_i$ which, in turn, is proportional to the input voltage $V_i$, that the system gain depends primarily on the ratio between the intrastage and input resistors, and that both the system gain and the available output voltage can be increased arbitrarily by increasing the number of stages in the amplifier.

Figure 3:
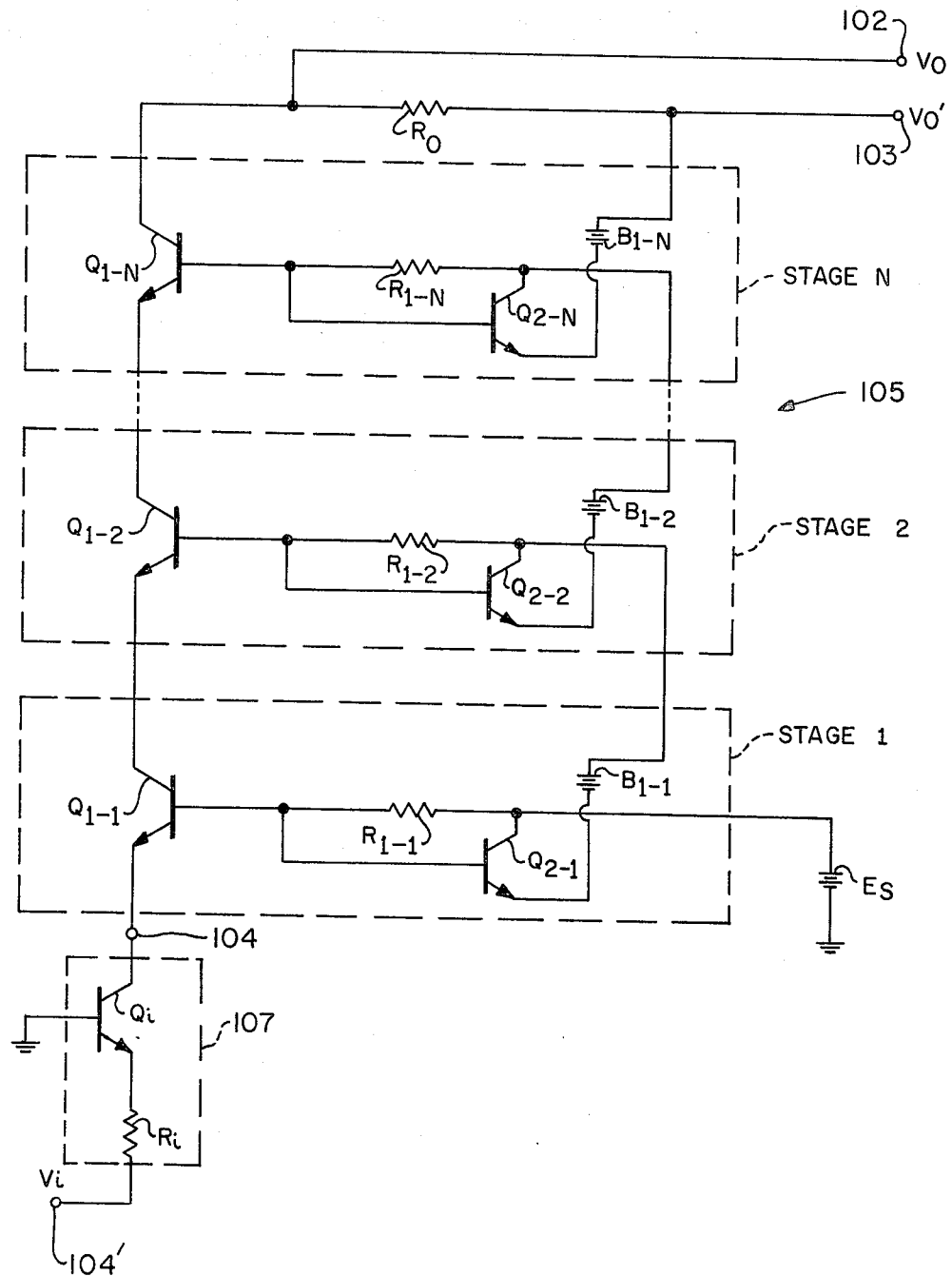
FIG. 3 is a schematic circuit diagram showing three stages of an N-stage high voltae amplifier having a low output impedance.

In some circumstances the high output impedance, approximately $(N+1)R$, of the amplifier discussed previously may be a disadvantage. This disadvantage can be avoided by the variant shown in FIG. 3 wherein the system numbered 105 comprises, in addition to the parts discussed in connection with the system 101, an extra transistor $Q_{2-1}, Q_{2-2}, \ldots Q_{2-N}$, respectively, in each stage. The operation of the system 105 is now explained with reference to FIG. 4 which is identical to FIG. 3 except that intermediate voltages (i.e. the transistor base potentials $V_1, V_2 \ldots V_N$), a load 109, and a load current flow path 108 are shown to facilitate the discussion.

Figure 4:
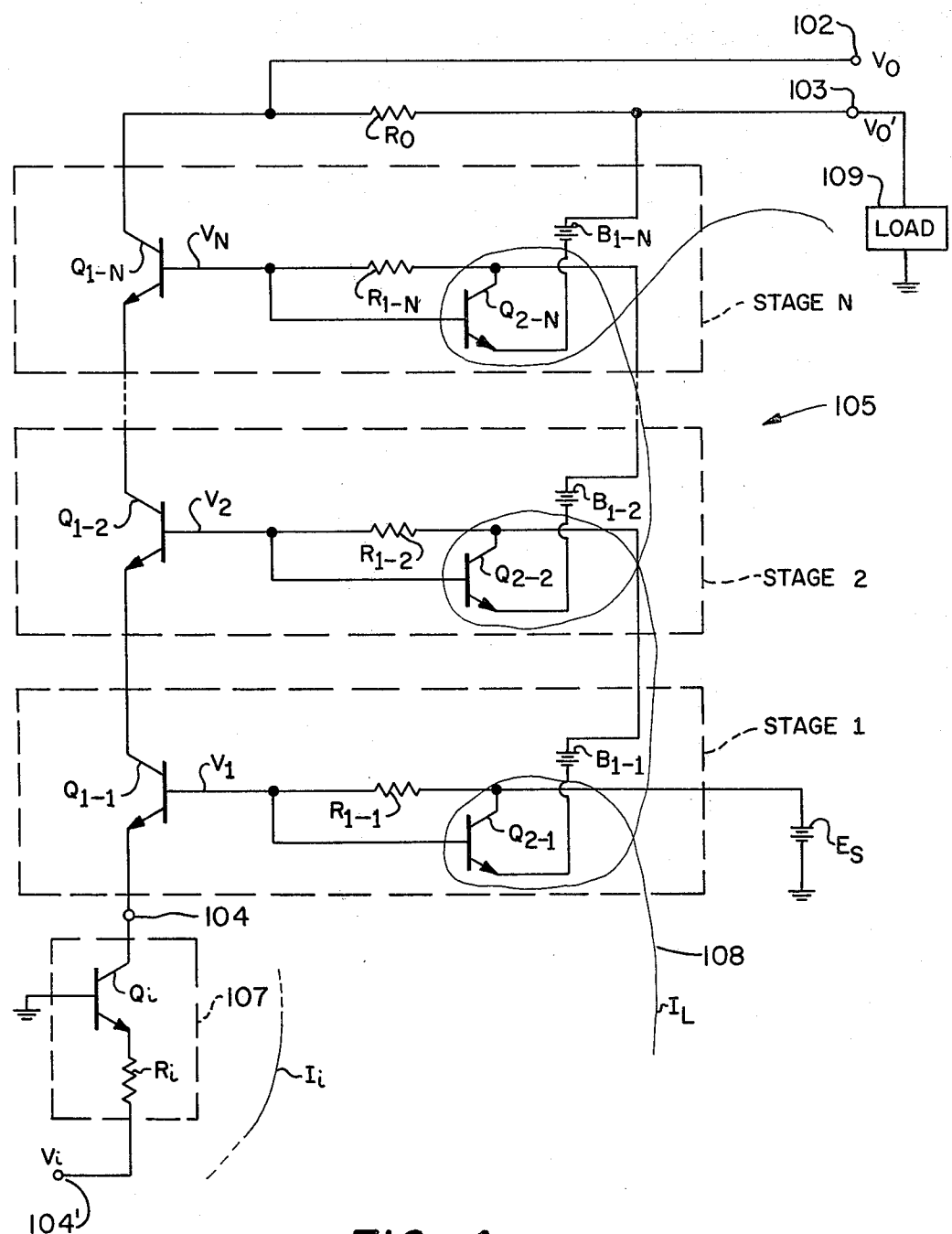
FIG. 4 is similar to FIG. 3 but additionally shows a load current flow path to facilitate discussion of the system operation.

The transistors $Q_{2-1}, Q_{2-2}, \ldots Q_{2-N}$ in FIG. 4 act as emitter followers. As is well known, emitter followers provide current gain and a voltage gain that is very slightly less than unity. Specifically, the voltage at the emitter of the transistor $Q_{2-1}$ always will be a fraction of a volt less positive than the voltage $V_1$; the voltage at the emitter of the transistor $Q_{2-2}$ always will be a fraction of a volt less positive than the voltage $V_2$, and so on. For most practical purposes these small voltage differences are negligible and it is sufficient to say that the voltage at the emitter of the transistor $Q_{2-1}$ is essentially equal to the voltage $V_1$; that the voltage at the emitter of the transistor $Q_{2-2}$ is essentially equal to $V_2$, and so on. Thus, again, the base potential (e.g., the voltage $V_1$) of one transistor of the string of transistors (i.e., the transistor $Q_{1-1}, Q_{1-2} \ldots Q_{1-N}$) is connected as bias to the next transistor of the string (e.g., the voltage $V_1$ is connected as bias for the transistor $Q_{1-2}$, etc.). With this explanation it can be seen that the maximum output voltage $V_o'$ at the output terminal 103 obtained when the input current $I_i$ is zero, is:

$$V'_o = E_s = B_{1-1} + B_{1-2} + \ldots + B_{1-N}$$

and that the voltage $V_o'$ will decrease linearly as increasing values of input current $I_i$ cause the intermediate voltages $V_1, V_2, \ldots V_N$ to decrease linearly in a manner analogous to that described earlier in connection with the system 101. But the path through which the load current flows is:

$$E_s \ldots Q_{2-1} \ldots B_{1-1} \ldots Q_{2-2} \ldots B_{1-2} \ldots$$

and so on; so the system output impedance is that determined by the impedance of the batteries and the emitter followers and such impedance can easily be made to be only a few ohms per stage.

It will be understood, on the basis of the foregoing explanation, that the linear amplifiers 101, 105 and 106, herein described each has one input 104 to receive an input current signal (whether it be a current derived from voltage signal $V_i$ or some other source) and two outputs 102 and 103 at which appear the voltages $V_o$ and $V_o'$, respectively, the difference between these voltages being the potential drop across resistor $R_o$.

In some circumstances the use of numerous individual intrastage batteries (i.e., floating batteries) may be a disadvantage. The disadvantage can be avoided, as shown in FIG. 5, by using capacitors $C_{1-1}, C_{1-2} \ldots C_{1-N}$ as energy storage elements in the linear amplifier labeled 106. Diodes $D_{1-1}, D_{1-2} \ldots D_{1-N}$ and $D_{2-1}, D_{2-2} \ldots D_{2-N}$ are included in each stage of the high voltage amplifier 106 to permit charging of the capacitors $C_{1-1}$, etc. In the system 106 in FIG. 5, it will be appreciated that if the input current is increased to a value sufficient to cause the transistors $Q_i, Q_{1-1}, Q_{1-2}, \ldots Q_{1-N}$ all to be saturated, then current also will flow along the path made up of $Q_i, D_{1-1}, C_{1-1}$, and $D_{2-1}$ so that a capacitor $C_{1-1}$ will be charged to a voltage essentially equal to the voltage of the primary power source $E_s$, and current also will flow through the path comprising $Q_i, Q_{1-1}, D_{1-2}, C_{1-2}, D_{2-2}$, and $D_{2-1}$ so that a capacitor $C_{1-2}$ also will be charged to a voltage essentially equal to the voltage of the primary power source $E_s$, and so on. As soon as the input current is decreased to a level at which the system is no longer saturated, all the diodes will be reverse biassed and essentially non-conducting so that the system of FIG. 5 then will behave in exactly the same manner as that described in connection with the systems discussed heretofore. In circuits wherein the emitter followers are omitted, the diodes $D_{1-1}, D_{1-2} \ldots D_{1-N}$ are also omitted.

As used herein the term "battery" denotes an electric storage battery or secondary cell (e.g., a lead-acid battery or a NICAD battery) as well as a primary cell (e.g., Leclanche cell). The "voltage supply means" embraces batteries, capacitors, solar cells, thermoelectric devices, fuel cells and other sources of electric energy. Thus, with reference to FIG. 1, such sources could be placed between points labeled $X_1$ and $Y_1, X_2$ and $Y_2 \ldots X_N$ and $Y_N$. In FIG. 6 such sources are included in the block labeled SVM between points X and Y to indicate any of the stages in FIG. 1, for example. Also, the capacitors $C_{1-1}$, etc., of FIG. 5 can be replaced by rechargeable batteries, e.g., $B_{1-1}$, etc.

More specifically, in FIG. 7 a group of solar cells is shown between points X and Y to emphasize an important facet of this invention. The linear amplifier herein disclosed is primarily useful to provide a high voltage output that can be regulated by a small signal input; as such, it is, indeed, a very useful regulated power supply. Thus, with reference to a system in which the supply voltage means or source of electric energy comprises solar cells, the low voltage individual solar cells can be combined to provide a high voltage output at terminals 102 and 103 that is regulated. Similar remarks apply also to the use of fuel cells and the other energy sources referred to.

Modifications of the invention herein described will occur to persons skilled in the art and all such modifications are considered to be within the spirit and scope of the invention as defined by the appended claims.

What is claimed is:

1. A linear amplifier having a plurality of stages connected in cascade including an input and an output stage, each of said stages including a transistor having an emitter, a collector and a base, said emitter and collector forming a series circuit between adjacent stages of the cascade, and a bias circuit connected to the base, each bias circuit including a bias resistor through which bias voltage is applied to the base and a separate source of bias potential connected to the bias resistor, the source of bias potential connected to the bias resistor of the input stage being a primary source of voltage while each of the other sources of bias potential is interconnected between the base and the bias resistor of the next succeeding stage.

2. The combination of claim 1 wherein each of said other sources of bias potential comprises a battery.

3. The combination of claim 2 including an emitter follower connected across said bias resistor for reducing interstage impedance between the battery supplying bias voltage to one stage and the bias circuit of the next succeeding stage.

4. The combination of claim 1 wherein each of said other sources of bias potential includes a capacitor interconnected between the bias resistors of adjacent stages.

5. The combination of claim 4 that includes diode means connected to charge each said capacitor from the primary source of voltage.

6. The combination of claim 4 including an emitter follower connected across each said bias resistor for reducing interstage impedance between the capacitor supplying bias voltage to one stage and the bias circuit of the next succeeding stage.

* * * * *